United States Patent [19]

Hill, III

[11] Patent Number: 4,528,516

[45] Date of Patent: Jul. 9, 1985

[54] DIFFERENTIAL AMPLIFIER WITH DYNAMIC THERMAL BALANCING

[75] Inventor: Thomas C. Hill, III, Beaverton, Oreg.

[73] Assignee: Tektronix, Inc., Beaverton, Oreg.

[21] Appl. No.: 519,472

[22] Filed: Aug. 1, 1983

[51] Int. Cl.³ .......................... H03F 3/45; H03G 3/20
[52] U.S. Cl. .................................... 330/254; 330/256; 330/278
[58] Field of Search ............... 330/252, 254, 256, 261, 330/289, 278

[56] References Cited

U.S. PATENT DOCUMENTS 3,900,801  8/1975  Furuno ................................. 330/254
4,169,247  9/1979  Watanabe ........................... 330/254

Primary Examiner—James B. Mullins
Assistant Examiner—G. Wan
Attorney, Agent, or Firm—George T. Noe

[57] ABSTRACT

A differential amplifier is provided with means to control the collector-to-emitter voltage thereof proportionately with quiescent current therethrough to dynamically maintain thermal balance therebetween when the gain setting is changed.

1 Claim, 3 Drawing Figures

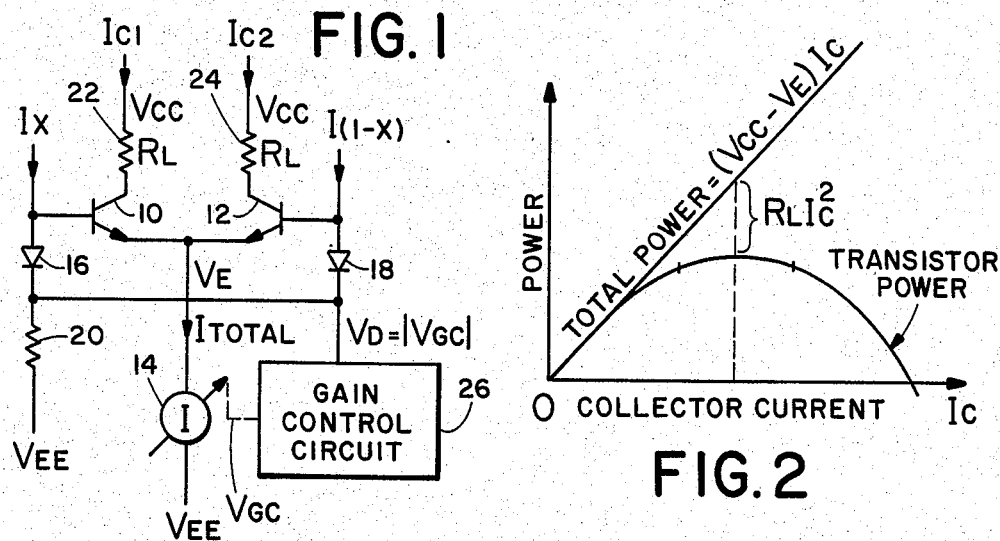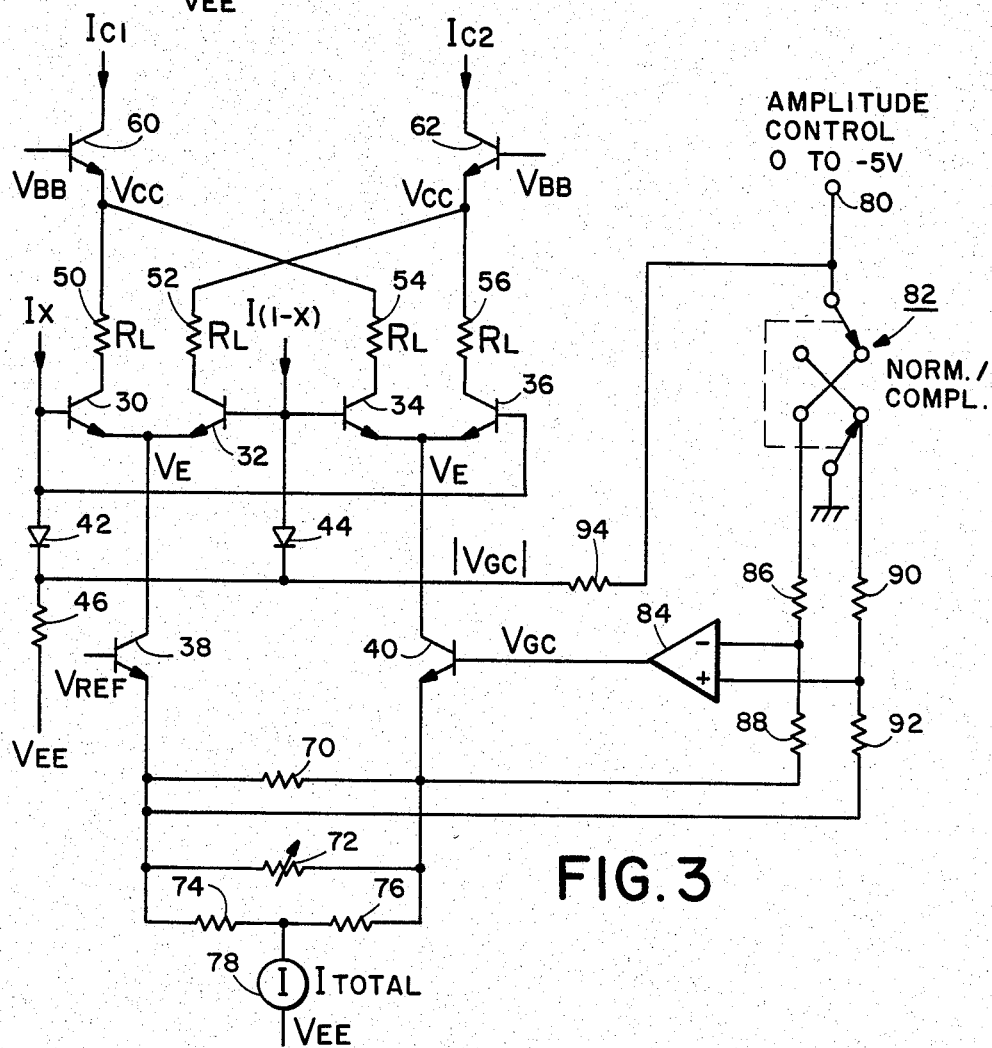

DIFFERENTIAL AMPLIFIER WITH DYNAMIC THERMAL BALANCING

BACKGROUND OF THE INVENTION

This invention relates to differential amplifiers in general, and in particular to a differential amplifier with dynamic thermal balancing.

Thermal distortion of signals through differential amplifiers results from temperature changes caused by the signal modulating the instantaneous power of the active devices, e.g., transistors, of the differential amplifier. These temperature changes cause the device parameters to change, in turn distorting the signals. Thermal distortion in solid-state devices is a problem well known to circuit designers, and attempts to solve this problem range from simply reducing signals (to reduce power in the devices) to various compensation and error-correction circuits added to the circuit.

A particularly popular differential amplifier for use in electronic instruments is the integrated circuit gain cell taught by Gilbert in U.S. Pat. No. 3,689,752, which is assigned to the assignee of the present invention. The utility of the Gilbert gain cell as a variable gain amplifier is well known. Here, a differential input signal is applied to two pairs of emitter-coupled transistors, while a gain control signal is applied to a pair of current-sourcing transistors to control the current through the amplifying transistors and thus modulate the amplified signal.

One solution to the foregoing problem is taught by Arthur J. Metz in U.S. Pat. No. 4,340,866, which is assigned to the assignee of the present invention. Metz added a pair of compensation transistors connected to oppose the outputs of a pair of gain-controlled transistors. While this method of correcting thermal distortion is effective, it would be desirable to maintain thermal balance between the two sides of the differential amplifier rather than to correct for changes in thermal balance.

In looking at the problem of thermal balance, it is to be noted that the collectors of the amplifying transistors are connected to a source of voltage $V_{CC}$ through thermal balancing resistors $R_L$, and thermal balance is attained when $(I_{TOTAL})*(\frac{1}{2}R_L)=(V_{CC}-V_E)$, wherein $I_{TOTAL}$ is the total current provided to the amplifying transistors. In this condition, maximum power is dissipated in the transistors when $I_1=I_2$, that is, when the current through the two sides of the differential amplifier is equal, and power dissipation decreases in both sides of the amplifier equally with instantaneous input signal swing. If $I_{TOTAL}$ is changed, for example, by selecting a new gain setting, the thermal balance is upset.

SUMMARY OF THE INVENTION

In accordance with the present invention, a differential amplifier is provided with means to control $V_{CC}-V_E$ of the active amplifying devices to dynamically maintain thermal balance therebetween when the gain setting is changed.

A gain control circuit provides a gain control voltage $V_{GC}$ to a variable current source connected to the emitters of the differential amplifier transistors thereby to control the standing current through the differential amplifier transistors. Thus, changes in current $I_{TOTAL}$ are effected to control the gain of the amplifier. A voltage proportional to the absolute value of the gain control voltage (which may be positive or negative) is produced and applied via diodes to the bases of the differential amplifier transistors thereby to establish the emitter voltage $V_E$ of the amplifier transistors.

In a commercial embodiment employing a Gilbert gain cell comprising two pairs of emitter-coupled amplifying transistors and a pair of differential current source transsistors, a single-polarity amplitude control voltage is applied to an operational amplifier which is selectably operable in both inverting and non-inverting modes to generate a suitable gain control voltage for application to the differential current source transistors. Since the amplitude control voltage is effectively proportional to the absolute value of the gain control voltage, it is directly coupled to the bases of the amplifying transistors to establish the emitter voltage thereof.

The main feature of the invention is to maintain thermal balance in a differential amplifier as gain-setting current therefor is changed, by changing the collector-to-emitter voltage, to reduce thermal distortion.

Another feature of the invention is to provide a variable-gain differential amplifier with dynamic thermal balancing over a wide range of gain settings.

Other features, attainments, and advantages will become apparent to those skilled in the art upon a reading of the following description when taken in conjunction with the accompanying drawings.

BRIEF DESCRIPTION OF THE DRAWINGS

FIG. 1 is a schematic diagram of a differential amplifier having dynamic thermal balancing in accordance with the present invention;

FIG. 2 is a graph of a transistor power curve; and

FIG. 3 is a schematic diagram of a commercial embodiment of the present invention.

DETAILED DESCRIPTION OF THE INVENTION

Referring to FIG. 1, there is shown a differential amplifier comprising emitter-coupled transistors 10 and 12, the emitters of which are coupled to a suitable source of voltage $V_{EE}$ through a variable current sink 14. Input signal currents $I_X$ and $I_{(1-X)}$ are applied to the bases of transistors 10 and 12, respectively, as well as to a pair of respective linearizing diodes 16 and 18, the cathodes of which are connected together to voltage source $V_{EE}$ via resistor 20. The current $I_{TOTAL}$ demanded by current sink 14 is split between transistors 10 and 12 and is conducted through collector resistors 22 and 24, respectively, as currents $I_{C1}$ and $I_{C2}$ from suitable voltage sources $V_{CC}$. Resistors 22 and 24 have a predetermined value $R_L$, and in this case are thermal-balancing resistors as well as load resistors. Thermal balance between transistors 10 and 12 is attained when $(I_{TOTAL})*(\frac{1}{2}R_L)=\frac{1}{2}(V_{CC}-V_E)$. In this condition, maximum power is dissipated in the transistors when $I_{C1}=I_{C2}$, and power dissipation decreases equally in both sides of the amplifier with instantaneous input signal swing. FIG. 2 facilitates an understanding of this phenomena.

FIG. 2 shows a graph of transistor power dissipation versus collector current. The straight line extending from the origin represents total power available in terms of $(V_{CC}-V_E)$ and $I_C$. However, because of the exponentially increasing power dissipation in the resistors 22 and 24 as current $I_C$ is increased, the power dissipation in the transistor itself is represented as a parabola wherein power dissipation is zero at the origin (because the transconductance is zero with zero current), then peaks at some point as current $I_C$ is increased, and finally returns to zero, presumably at saturation, because all of the available power is dissipated in the load resistor. Thermal balance is achieved when standing current $I_C$ is at the peak of the parabola. This point is indicated by the vertical dashed line. When a symmetrical input signal, as an example, is applied, the current $I_C$ is modulated such that the power dissipation curve may be that shown between the two hashmarks.

Referring again to FIG. 1, it can be discerned that if the current $I_{TOTAL}$ is changed by varying the current sink 14, collector current $I_{C1}$ and $I_{C2}$ change accordingly, and the thermal balance is upset because the quiescent power dissipation moves away from the peak of the parabolic power curve. A gain control circuit 26 provides a gain control voltage $V_{GC}$ to variable current sink 14 to change the setting of current $I_{TOTAL}$ thereby to set the gain of the differential amplifier. Gain control circuit 26 also produces a voltage proportional to the absolute value of the gain control voltage, which is applied to the cathodes of diodes 16 and 18. Because the voltage drops of diodes 16 and 18 and the base-emitter junctions of transistors 10 and 12 are equal, the absolute value voltage, labeled $V_D = V_{GC}$, becomes emitter voltage $V_E$. Thus, when current $I_{TOTAL}$ is changed, emitter voltage $V_E$ is changed proportionately so that the relationship $(I_{TOTAL})*(\frac{1}{2}R_L) = \frac{1}{2}(V_{CC} - V_E)$ is maintained thereby to maintain thermal balance for all gain settings.

The gain control circuit 26 may suitably be a potentiometer connected between suitable sources of positive and negative voltage, with the wiper arm thereof providing the gain control voltage $V_{GC}$. The voltage $V_{GC}$ may be applied to an absolute value amplifier to produce the desired absolute value voltage. Other circuit arrangements for providing gain voltage and a corresponding absolute value thereof may be implemented, depending upon the amplifier design.

FIG. 3 shows a commercial embodiment of the present invention. Transistors 30, 32, 34, and 36 are connected in the gain cell configuration taught by Gilbert in U.S. Pat. No. 3,689,752. The emitters of transistors 30 and 32 are connected together to the collector of a current sink transistor 38, while the emitters of transistors 34 and 36 are connected together to the collector of a current sink transistor 40. The bases of transistors 30 and 36 are connected together and receive an input signal current $I_X$, which is also applied to linearizing diode 42, while the bases of transistors 32 and 34 are connected together to receive an input signal current $I_{(1-x)}$, which is also applied to a linearizing diode 44. The cathodes of diodes 42 and 44 are connected together and returned to a suitable source of voltage $V_{EE}$ through resistor 46. Thermal balancing resistors 50, 52, 54, and 56 are provided for the collectors of transistors 30, 32, 34, and 36, respectively. The collectors of transistors 30 and 36 are coupled to the emitters of common-base amplifier transistors 60 and 62, respectively. The collectors of transistors 32 and 34 are cross-coupled to the collectors of transistors 36 and 30, respectively. A fixed voltage $V_{CC}$ is established at the emitters of transistors 60 and 62, while collector current $I_{C1}$ and $I_{C2}$ pass therethrough to an output circuit or other stage of amplification.

The emitters of the current sink transistors are coupled together by resistors 70, 72, 74, and 76, and returned to a source of voltage $V_{EE}$ through current sink 78, which produces a current $I_{TOTAL}$ to be differentially split between transistors 38 and 40 thereby to provide standing currents for the two halves of the amplifier.

In this embodiment, a single-polarity amplitude control voltage, for example, from zero to $-5$ volts, is applied from an external source to a terminal 80. This voltage is applied via a double-pole double-throw reversing switch 82 to one input of an operational amplifier 84. The other input of operational amplifier 84 is coupled to ground via the switch 82. Resistors 86 and 88 connected between switch 82 and the emitter of transistor 40 provide respectively the input and feedback impedances for the inverting input of operational amplifier 84, while resistors 90 and 92 connected between switch 82 and the emitter of transistor 38 provide respectively the input and feedback impedances for the non-inverting input of operational amplifier 84. The output of operational amplifier 84 is connected to the base of transistor 40 to apply a gain control voltage $V_{GC}$ thereto, while a reference voltage $V_{REF}$, which may be ground potential, is applied to the base of transistor 38. Operational amplifier 84 is selectably operable in both inverting and non-inverting modes, depending upon the setting of switch 82, so that the gain control voltage may selectably be either positive or negative.

Since the single-polarity amplitude control voltage applied to terminal 80 is effectively proportional to the absolute value of gain control voltage $V_{GC}$, it is directly coupled via resistor 94 to the cathodes of diodes 42 and 44, and hence to the emitters of transistors 30, 32, 34, and 36. It is to be noted that this gain control circuit is implemented differently from that described for FIG. 1, yet achieves the same objective: when current is shifted between the two halves of the amplifier changing the standing current, emitter voltage $V_E$ is changed proportionately so that the relationship $(I_{TOTAL})*(\frac{1}{2}R_L) = \frac{1}{2}(V_{CC} - V_E)$ is maintained thereby to maintain thermal balance for all gain settings.

While I have shown and described the preferred embodiment of my invention, it will be apparent to those skilled in the art that many changes and modifications may be made without departing from my invention in its broader aspects. For example, in certain differential configurations, collector voltage $V_{CC}$ could be varied rather than emitter voltage $V_E$ to achieve the same results. I therefore intend that the appended claims cover all such changes and modifications as fall within the scope of my invention.

What I claim as my invention is:

1. A variable-gain differential amplifier with dynamic thermal balancing, comprising:

means for providing a selectable gain control voltage and an absolute value voltage which is proportional to the absolute value of said gain control voltage;

at least one pair of emitter-coupled transistors, each having a base for receiving input signals and a collector coupled to a load resistor; and variable current generator means responsive to said gain control voltage coupled to said emitters of said emitter-coupled transistors for providing selectable quiescent current through said transistors;

wherein said absolute value voltage is coupled to both bases of said emitter-coupled pair of transistors thereby to control the collector-to-emitter voltage of said transistors such that said collector-to-emitter voltage is changed proportionately with changes in said selectable quiescent current.

\* \* \* \* \*